United States Patent [19]
Roberts

[11] Patent Number: 5,652,800
[45] Date of Patent: Jul. 29, 1997

[54] AUTOMATIC MIXER PRIORITY CIRCUIT

[75] Inventor: John H. Roberts, Hickory, Miss.

[73] Assignee: Peavey Electronics Corporation, Meridian, Miss.

[21] Appl. No.: 556,871

[22] Filed: Nov. 2, 1995

[51] Int. Cl.$^6$ ..................................... H04B 1/00
[52] U.S. Cl. .......... 381/119; 381/122; 381/94.1
[58] Field of Search ................... 381/119, 92, 94, 381/122

[56] References Cited

U.S. PATENT DOCUMENTS

| | | |
|---|---|---|
| 3,755,625 | 8/1973 | Maston . |
| 3,814,856 | 6/1974 | Dugan . |
| 3,992,584 | 11/1976 | Dugan ........................... 381/119 |
| 4,149,032 | 4/1979 | Peters . |
| 4,357,492 | 11/1982 | Campbell et al. . |
| 4,359,602 | 11/1982 | Ponto et al. . |
| 4,374,300 | 2/1983 | Ponto et al. . |
| 5,148,491 | 9/1992 | Sakamoto et al. . |
| 5,259,035 | 11/1993 | Peters et al. . |
| 5,291,558 | 3/1994 | Ross . |
| 5,309,517 | 5/1994 | Barclay . |
| 5,402,500 | 3/1995 | Sims, Jr. . |
| 5,414,776 | 5/1995 | Sims, Jr. . |

Primary Examiner—Forester W. Isen
Attorney, Agent, or Firm—Watson Cole Stevens Davis, P.L.L.C.

[57] ABSTRACT

A proportional, multichannel gain sharing audio circuit has a gain control in the computing leg so that additional weight may be accorded the channel so that the channel is allocated greater gain in proportion to the total amount of signal available to all of the channels combined. Weighting may be adjustable and more than one channel may have such a feature, so that a hierarchy of priority is possible.

7 Claims, 3 Drawing Sheets

AUTOMATIC MIXER PRIORITY CIRCUIT

BACKGROUND OF THE INVENTION

The invention is directed to a circuit that prioritizes one or more of a plurality of input channels. In particular, the invention is directed to an automatic microphone mixer having adjustable priority.

Voice activated systems allow a plurality of talkers to converse over a corresponding number of input channels. When an individual is talking above a given threshold, the other channels are muted or blanked by a fixed amount. This allows the participants to direct their attention to and hear the particular talker while preventing or reducing feedback noise.

One significant shortcoming of such an approach is that the threshold level necessary to cause blanking or muting of the other talkers is often set so low that extraneous noise may cause the system mute out important discourse. In order to alleviate this problem, various gain sharing strategies have been developed in which the signal level in a particular channel is compared with the sum of all the channels to compute a gain sharing factor. The channel with the highest level input receives highest gain which is a proportional fraction of the total gain available. The advantage of such a system is that the total gain available to a particular location is not excessive.

Some known systems permit gain control to the audio circuit but this does not solve the priority problem, it simply allows one channel, when actuated, to have a higher volume. This can result in feedback problems which multiple channel systems seek to avoid.

It is therefore desirable to provide an automatic microphone mixer which allows priority without significant feedback.

SUMMARY OF THE INVENTION

The present invention is based upon the discovery than an automatic mixer may include a proportional gain sharing circuit which includes a gain control in the computing leg of the circuit for establishing a weighting factor so that additional weight may be accorded to the channel such that the additional greater gain is allocated to that channel in proportion to the total amount of signal available to all of the channels combined. Thus, while the audio channels may all have the same gain available, the computing circuit for each channel produces a weighted signal which establishes priority to said channel. The weighting factor may be adjustable and more than one channel may have such a weighting factor. For example, one channel may have a 3 db priority over a second priority channel and a 9 db priority over all other channels. The second channel would likewise have a 6 db priority over the remaining channels except for the first channel. The gain sharing strategy, however, remains dynamic and natural, and feedback sensitivity is reduced.

In a particular embodiment, the invention comprises a priority circuit for an automatic proportional gain sharing sound mixer which prioritizes and shares the gain of a plurality of input channels carrying corresponding input signals at various levels.

The priority circuit includes a channel level circuit for each channel for receiving the corresponding input signal and producing an individual channel level signal having a value indicative of the level of said input signal for such channel. A summing channel commonly coupled to each channel receives the input signals and produces a combined channel level signal having a total value indicative of the sum of all the values of said individual level signals. A comparator for each channel is responsively coupled to the corresponding individual channel level circuit and the summing channel for providing a weighted channel signal indicative of the weight of such input signal as a function of the value of the ratio of the individual channel level signal to the combined channel level signal. A circuit responsively coupled to the input signal and the weighted channel signal produces an channel output signal proportional to the weight accorded to the input signal so that the gain of the channel is shared in proportion to the weighted signal. At least one of the channels has a gain varying device which is responsive to the input signal and is operatively connected to the corresponding channel level circuit for varying the level of the individual channel level signal so that the weighted channel signal varies therewith and the corresponding channel has more or less priority relative to other channels.

In a particular embodiment, the channel level circuit is a logarithmic level detector for producing the value signal in db. The summing circuit may take the form of a summing operational amplifier. The comparator circuit may comprise a differential operational amplifier and the circuit responsive to the signal may include a voltage controlled amplifier. The gain varying circuit in one form may comprise a variable impedance at the input of the detector.

DESCRIPTION OF THE INVENTION

Figure 1:
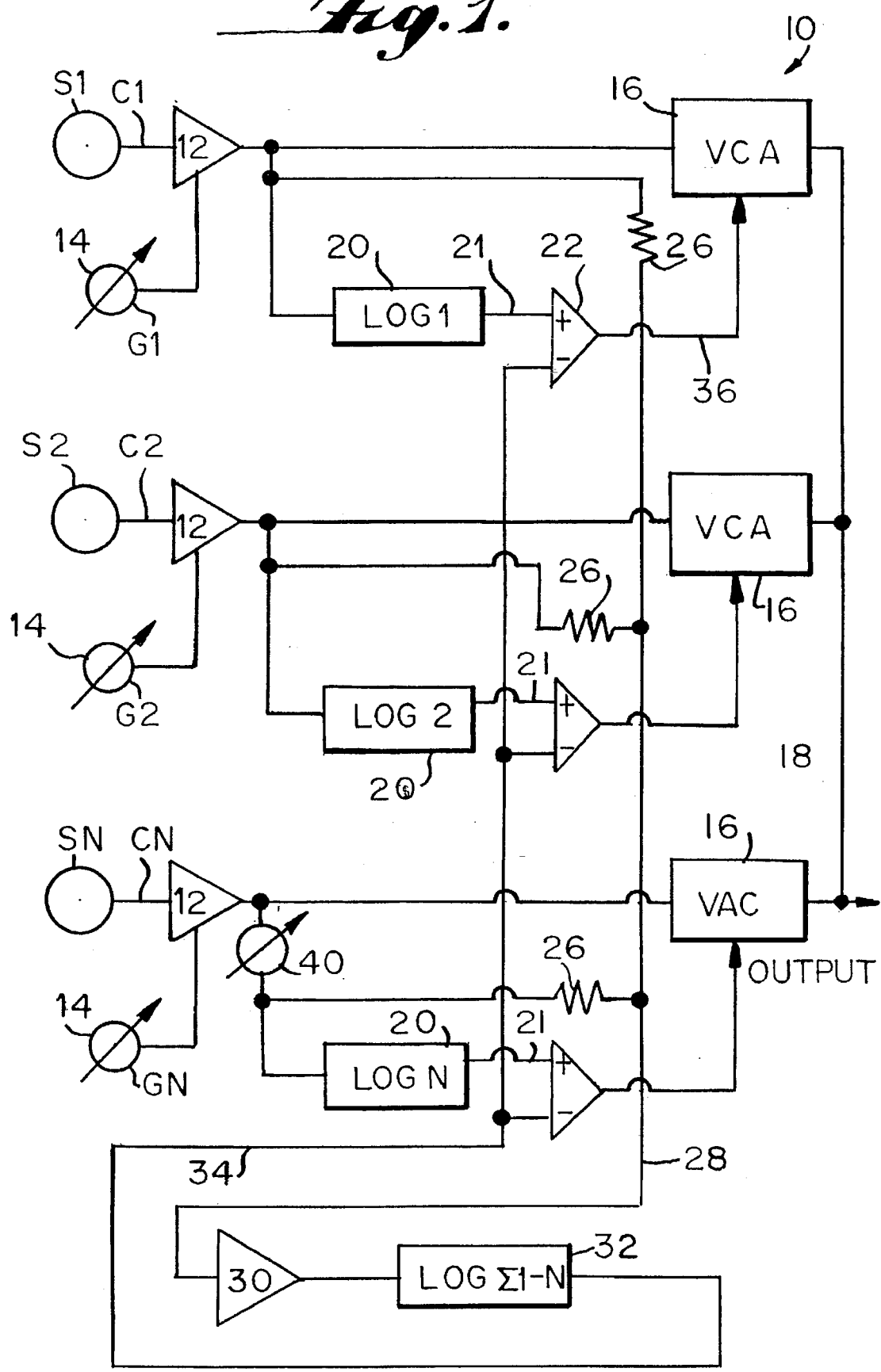
FIG. 1 is a schematic diagram of a priority circuit in accordance with the present invention.

FIG. 1 illustrates in schematic block form a priority circuit 10 for a plurality of signal sources S1–SN in accordance with the present invention. The plurality of signal sources S1, S2–SN may each be coupled to the input of corresponding channels C1, C2 ... CN for amplification. Each channel includes an audio leg for providing an audio output, and a computing leg computing proportional gain sharing. Each audio leg includes an amplifier 12 which may include a variable gain control 14. The amplifier 12 is coupled to a voltage controlled amplifier 16 which in turn is coupled to a common output 18 for the various channels. Channels C2–CN are likewise configured in a similar way. The voltage controlled amplifier 16 varies the output signal in accordance with a control arrangement hereinafter described. In general, however, if the input signal to the amplifier 12 is low, the output for that channel is low.

The computing leg for determining the channel level of each of the channels C1–CN includes a detector circuit 20 responsively coupled to the output of the amplifier 12. The detector circuit 20 produces a channel level signal at its output 21 having a value representative of the channel level. The channel level signal is provided as an input to a comparator 22, the output of which is coupled to a control input of the voltage control amplifier 16. The comparator 22 is adapted to sense the difference between the detector output and a signal representative of the total of all detector outputs. In other words, each comparator 22 senses the difference between the signal level in each channel and the total signal level in the system.

In order to determine the total signal level value, each channel C1–CN has a sensing resistor 26 connected to the output of the amplifier 12. The sensing resistors 26 are commonly coupled together, as illustrated, by a common lead 28 which is provided as an input to a summing amplifier 30. The output of the summing amplifier 30 is coupled to a sum of all channels detector circuit 32, which is similar to the aforementioned detector circuits 20, the output of which is coupled to the inverting input of each of the comparators 22. Thus, in the first channel C1, the signal level value thereof, as provided by the output detector 20, is compared with the signal level value of the sum of all channels as provided on lead 34. The difference is provided as an output on lead 36 for controlling the voltage controlled amplifier 16. The output of the voltage controlled amplifier 16 is proportional the ratio of the signal level to the sum of all channels signal. Thus, the strongest channel receives the highest output and the inactive channels have little or no output.

An important feature of the invention is the provision for a variable gain input to one or more of the detectors 20. For example, in FIG. 1, channel N has a variable gain control 40 at tile input of detector 20 and resistor 26 which provides a signal to the sum of all channels detector 32. Gain control provides an increased input to the detector 20 such that the channel CN is essentially biased higher than the other channels. Thus, when the comparator 22 in the channel CN looks at the output of the detector 20, it essentially sees a higher effective input signal. The comparator 22 translates such effective input into a higher control signal for the voltage controlled amplifier 16. Thus, in the example illustrated, the talker in the Nth channel CN has priority over talkers in the other channels.

It is possible to add additional gain controls 40 to the other circuits and set them at various levels so that, for example, more than one individual may have priority over the remaining channels with an independent priority between the hierarchal levels.

Figure 2:
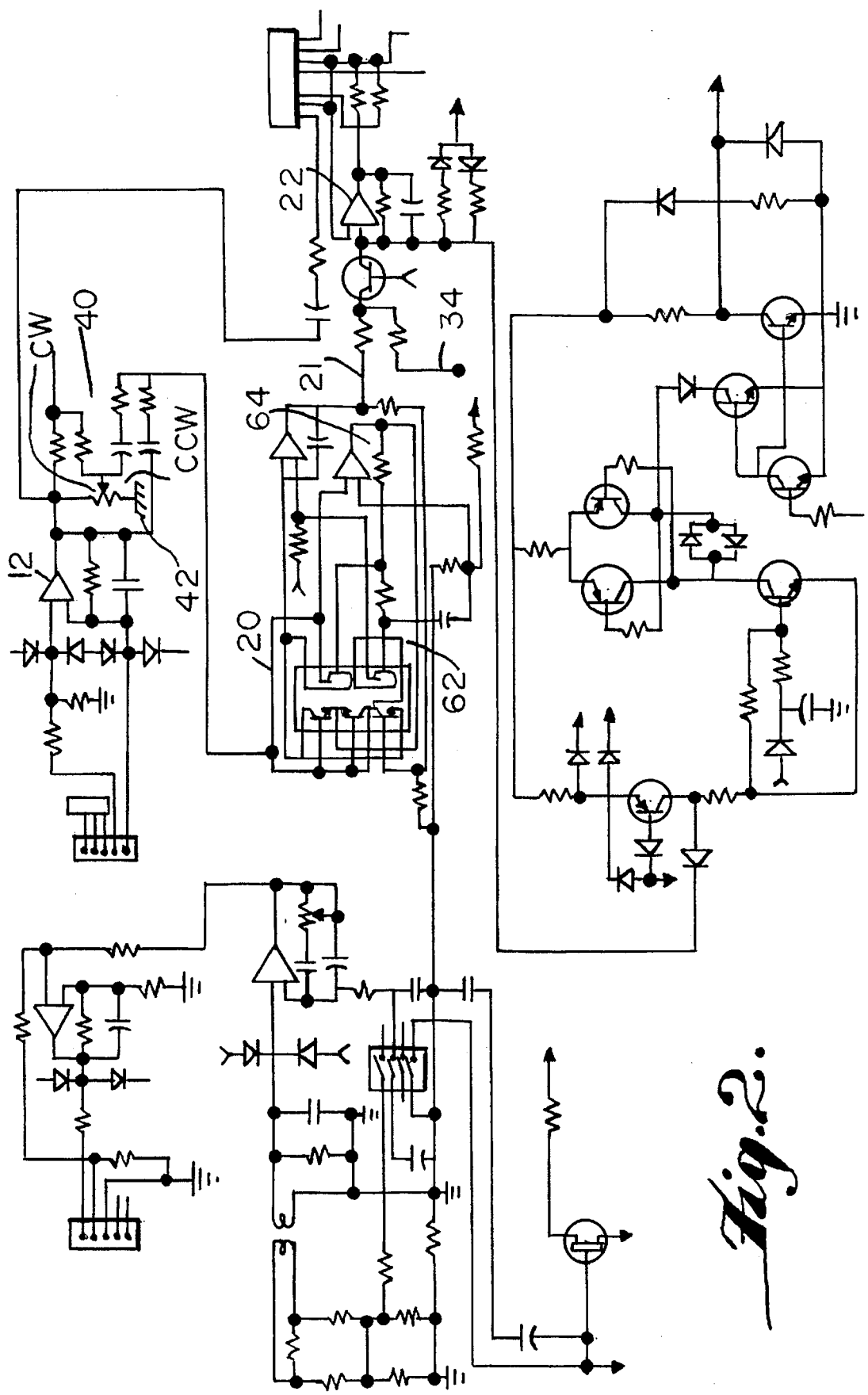
FIG. 2 is a schematic diagram of the detector and priority circuit.
Figure 3:
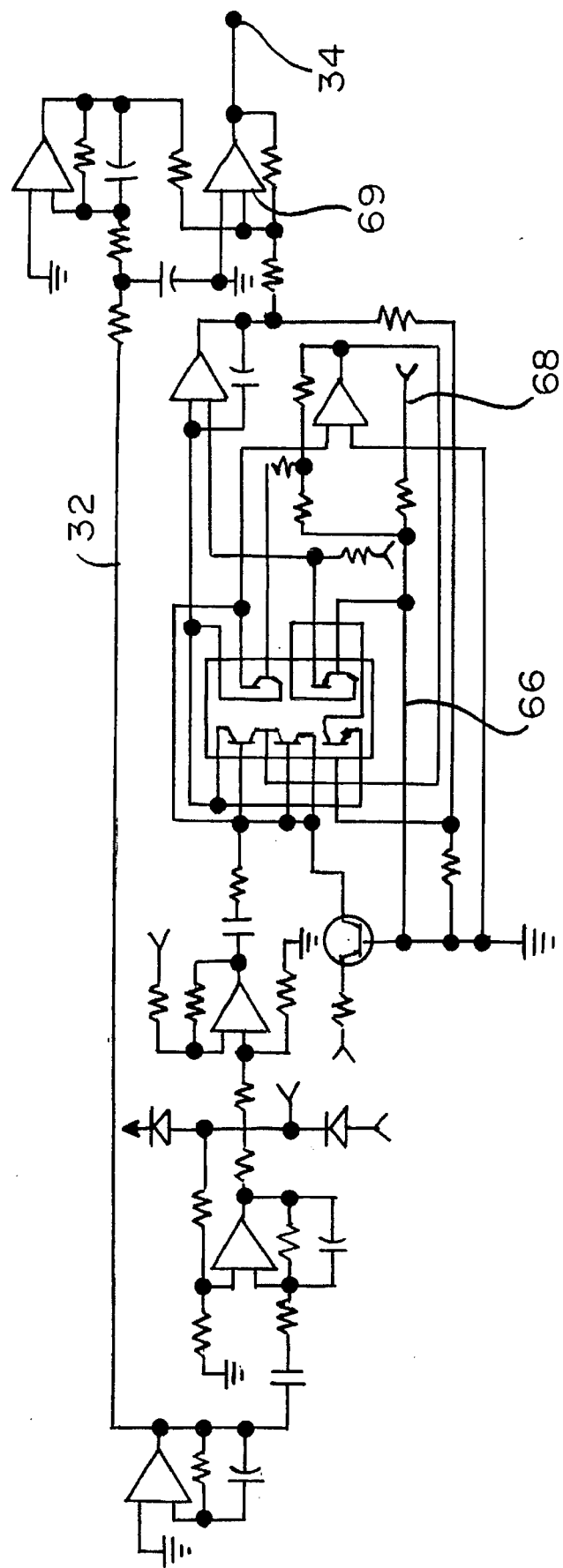
FIG. 3 is a schematic diagram of the sum of all signals detector circuit.

FIGS. 2 and 3 illustrate an embodiment of the invention. In FIG. 2, the amplifier 12, e.g. an operational amplifier, feeds the gain control 40 which includes a potentiometer 42. When the potentiometer 42 is in full clockwise (CW) position, the system has maximum priority. When the potentiometer is in the full counterclockwise (CCW) position, i.e., the wiper is near ground, there is no priority provided. The output of the gain control is coupled to the detector circuit 20 which includes a rectifier 62 and log detector circuit 64. The output 21 of the channel level detector circuit 20 feeds the comparator 22.

FIG. 3 shows the sum of all signals detector circuit 32 which includes rectifier 66 and log detector circuit 68 feeding inverter 69. The (inverted) output 34 of detector circuit 32 is algebraically summed with the output 21 of channel level detector circuit 20. The detector circuits 20 and 32 may include log detector circuits, as described, for converting the input signals to signals which represent the inputs in db and thus the kinds of circuits particularly useful in audio systems.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed:

1. A priority circuit for an automatic gain sharing sound mixer for prioritizing and sharing the gain of a plurality of input channels carrying corresponding input signals at various levels comprising:

channel level means for each channel for receiving the corresponding input signals and producing an individual channel level signal having a value indicative of the level of said input signal for such channel;

summing means commonly coupled to each channel for receiving the input signals and producing a total channel level signal having a total value indicative of the sum of the individual channel levels;

comparator means for each channel responsively coupled to the corresponding individual channel level signal and the total channel level signal for producing a weighted channel signal indicative of the weight of said input signal as a function of the value of the ratio of individual channel level signal to the total channel level signal;

signal responsive means for each channel responsively coupled to the input signal for the corresponding channel and the weighed channel signal for producing a channel output signal proportional to the weight of said input signal for the channel so that the gain of the channel is shared in proportion to the weight signal; and at least one gain varying means responsively coupled to a corresponding one of said channel level means for receiving the corresponding channel level signal of such channel and operatively connected to the summing means for varying the level of the individual channel level signal such that the weighted signal varies therewith and the corresponding channel has more or less priority relative to other channels in accordance with said gain varying means.

2. The priority circuit of claim 1 further comprising a logarithmic detector for each channel for producing the value of the level of said input signal in db.

3. The priority circuit of claim 1 wherein the summing means comprises a summing amplifier.

4. The priority circuit of claim 1 wherein the summing means includes a logarithmic detector for producing the total value of the sum of the levels in db.

5. The priority circuit of claim 1 wherein the comparator circuit comprises a differential amplifier.

6. The priority circuit of claim 1 wherein the signal responsive means comprises a voltage controlled amplifier.

7. The priority circuit of claim 1 wherein the gain varying means comprises a variable impedance connected between an output of the corresponding channel level means and an input for the summing means.

* * * * *